United States Patent [19]

Pickar

[11] 4,048,647

[45] Sept. 13, 1977

[54] SOLID STATE DISCONNECT DEVICE

[75] Inventor: Kenneth Arnold Pickar, Kanata, Canada

[73] Assignee: Northern Telecom Limited, Montreal, Canada

[21] Appl. No.: 722,086

[22] Filed: Sept. 10, 1976

[51] Int. Cl.$^2$ ............................................. H01L 29/80
[52] U.S. Cl. ................................. 357/22; 179/81 R; 357/20; 357/51
[58] Field of Search ............... 179/81 R, 184; 357/22, 357/51, 20

[56] References Cited

U.S. PATENT DOCUMENTS

| | | | |
|---|---|---|---|
| 3,181,033 | 4/1965 | Bakker | 179/81 R |
| 3,683,491 | 8/1972 | Nelson et al. | 357/51 |
| 3,755,722 | 8/1973 | Harland et al. | 357/51 |
| 3,801,886 | 4/1974 | Imaizumi et al. | 357/51 |
| 3,890,543 | 6/1975 | Jonassen | 179/184 |
| 3,975,752 | 8/1976 | Nicolay | 357/22 |
| 3,977,020 | 8/1976 | Enzlin et al. | 357/51 |
| 3,987,253 | 10/1976 | Pipitone | 179/81 R |

FOREIGN PATENT DOCUMENTS 1,349,963  2/1964  France .................................... 357/22

OTHER PUBLICATIONS

D. Engling et al., "A Sing. Substr. Thin Film Active Tele. Net. Using TMM Caps. and Tant. Nitride Res.," Proc. 1970 Elec. Comp. Conf., Wash. D.C., (May 13-15, 1970), pp. 320-328.

K. Richardson, "Microelectronics Opens New Prospects for Station Apparatus," Telephony, vol. 184, No. 12, Mar. 19, 1973, pp. 51-55.

Primary Examiner—Stanley D. Miller, Jr.
Assistant Examiner—Joseph E. Clawson, Jr.
Attorney, Agent, or Firm—Sidney T. Jelly

[57] ABSTRACT

A solid state disconnect or isolating device for disconnecting a subscriber on his premises, replaces a relay with associated circuitry and items. It can be coupled with a surge protection device to provide disconnect signalling, plus loop testing if desired. The device comprises a normally "on" junction field effect transistor which acts as a pinch resistor.

6 Claims, 5 Drawing Figures

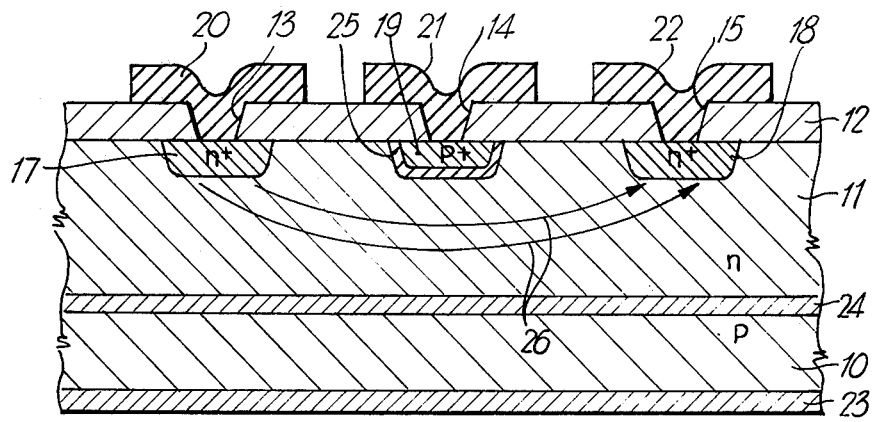
Fig-1a-
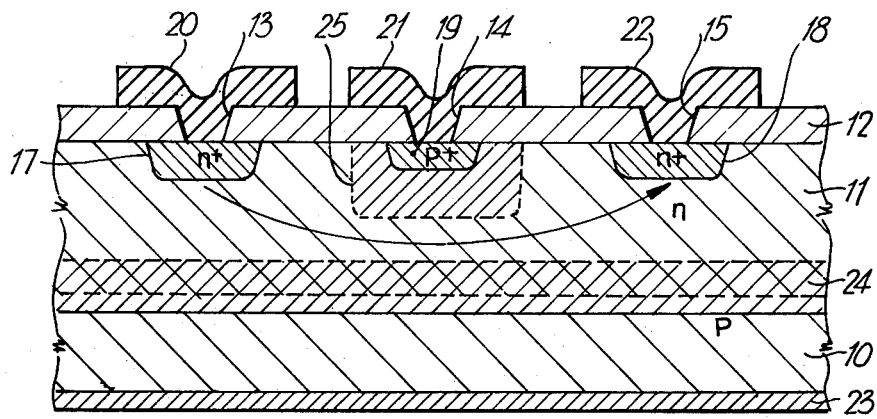
Fig-1b-
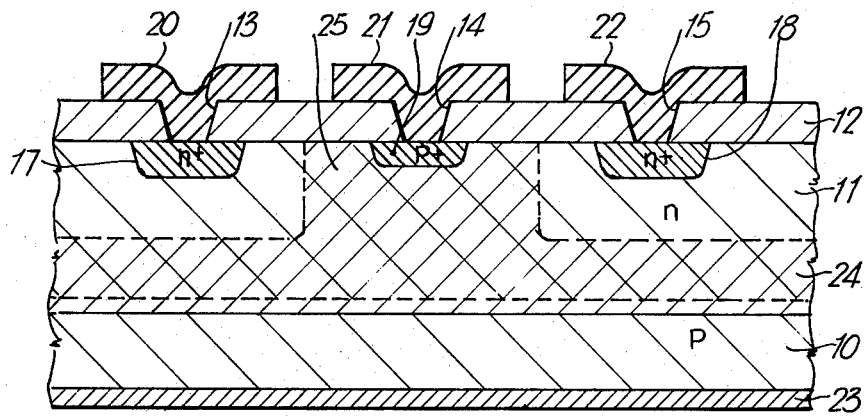
Fig-1c-

SOLID STATE DISCONNECT DEVICE

This invention relates to a solid state disconnect device, particularly though not exclusively for disconnection in a telecommunications system, such as used for subscriber isolation.

Subscriber isolating devices to disconnect a subscriber have a variety of forms but generally have in common a relay, relay clamping circuitry, a zener diode and a termination device.

In the present invention the relay is replaced by a normally-on solid state switch. Coupled with a range protection device and a suitable loop termination, the combined arrangement would enable central office generated disconnect signalling followed by a loop testing routine for fault isolation, if thus desired. The present invention provides an integrated circuit substrate for the relay with the advantage in that relay clamping circuitry and the zener diode are no longer required. A considerable cost reduction is possible.

The invention will be readily understood by the following description in conjunction with the accompanying drawings, in which:

FIGS. 1a, 1b and 1c are a diagrammatic vertical cross-section through one form of a device, illustrating progressive operation thereof;

Figure 2:
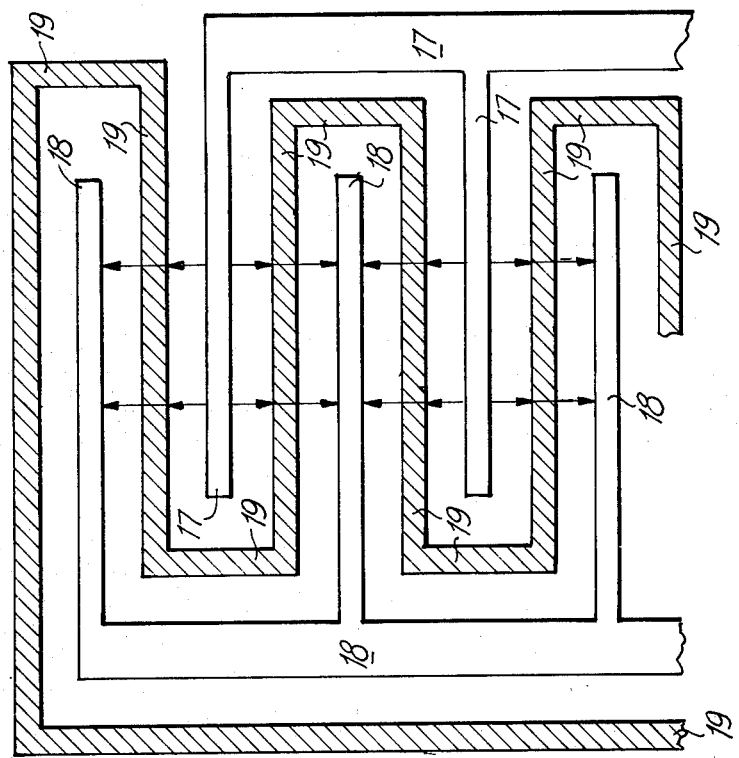
FIG. 2 is a diagrammatic plan view of one form of a structure.

Previous solid state device for telecommunications switching use pnpn arrangements which dissipate power in the on state. For circuit requirements at the customer interface, normally "on" characteristics are desired. The present invention provides a device which appears as a low value resistor ($<1\Omega$) when no external voltage is applied to the gate terminal.

As illustrated in FIG. 1, a device comprises a p-type substrate 10, n-type epitaxial layer 11 on layer 10, a SiO$_2$ insulating layer 12 on the epitaxial layer 11 with source, gate and drain area apertures or windows 13, 14 and 15 respectively formed in the SiO$_2$ layer 12. Diffusions are made with the epitaxial layer 11 through the apertures or windows 13, 14 and 15 to form source area 17 and drain area 18 of n+ type and gate area 19 of p+ type. Metal contacts 20, 21 and 22 are formed on the source, gate and drain areas respectively and a contact layer 23 is formed on the back surface of the substrate 10. P-n junction depletion regions are indicated by cross-hatching area 24 between substrate 10 and epitaxial layer 11 and area 25 between epitaxial layer 11 and gate 19.

Under normal operating conditions, as in FIG. 1(a) current flows from the source 17 to the drain 18 through the epitaxial layer 11 — the current flow represented by arrows 26. By applying a negative potential to the gate 19 and substrate 10, with respect to source 17, FIG. 1(b), the p-n junction depletion regions 24 and 25 grow, restricting current flow 26. Finally, with sufficient negative potential, the depletion regions 25 merge and the flow of current is cut off — as in FIG. 1(c).

A single "pinch resistor" structure as in FIG. 1 has excessive impedance, for the telecommunications applications for subscriber isolation. To reduce this impedance a number of devices are connected in parallel on a chip, as an interdigitated JFET (junction field effect transistor). One form of such a structure is illustrated, in plan view in FIG. 2. In FIG. 2, the source, drain and gate areas 17, 18 and 19 are shown, represented without the overlying S$_i$O$_2$ insulating layer and the metal contacts 20, 21, and 22.

The form of structure illustrated in FIG. 2 is economic in use of chip area and doubles the gate width of each device as current flows bilaterally. The portion of a structure illustrated in FIG. 2 can be considered as representative of four devices.

The parameters for the design of JFET are known and can be represented by the following:

a. Channel conductance in the linear region $$g = G_o \left[ 1 - \sqrt{\frac{\phi_B - V_G}{\phi_B - V_T}} \right] \quad (1)$$

where $$G_o = \frac{Zq\mu_n N_D d}{L} \quad (2)$$

b. Turn-off voltage $$V_T = \frac{-q N_D d^2}{8\kappa_S \epsilon_o} + \phi_B \quad (3)$$

c. Saturation current $$I_{DSAT} = G_o \left\{ \left[ \frac{2}{3} \sqrt{\frac{\phi_B - V_G}{\phi_B - V_T}} - 1 \right] (\phi_B - V_G) \right\} \quad (4)$$

d. Saturation voltage $$V_{DSAT} = -V_T - \phi_B + V_G \quad (5)$$

where
$\phi_B$ = built-in voltage
$Z$ = gate width
$\epsilon_o$ = dielectric constant
$L$ = gate length
$\mu_n$ = electron mobility
$N_D$ = epi doping
$d$ = epi thickness
$V_G$ = gate voltage
$V_T$ = turnoff voltage or pinch off voltage
$q$ = electronic change
$K_S$ = dielectric permitivity of semiconductor.

For a particular device, the following assumptions are typical — although variable as desired:

1. The device will operate at $-130V$ ($V_T = -120V$ for safety margin).
2. The minimum dimension is 5 $\mu$m.
3. The chip size is 100 mil$^2$.

All other parameters are determined from these assumptions. The maximum doping is selected consistent with assumption (1). From known breakdown curves material doped to $10^{15}$cm$^{-3}$ will avalanche at 150V for a 10 $\mu$m junction depth. These figures are conservative. Taking this doping as the impurity concentration in the epi layer, an epitaxial layer thickness is calculated from Eq. (3).

$$d = 25 \ \mu m$$

Note that the single junction depletion width at 120V is half this value or 12.5 μm. The above value for $d$ arises, assuming constant epi doping, from the combined depletions from substrate and gate into the epi regions.

To determine the channel conductance, consider two cases $V_G = 0$ and $V_G = -48V$ assuming that the gate voltage can fluctuate up to a value 48V below the source potential. Then from Eqs. (1,2).

$g$ 32 0.13 $v$ for $V_G = 0$
$g = 0.045$ $v$ for $V_G = -48$ volts,
assuming geometric values of $Z = 2.5$ mm and $L = 25$ μm. Because current flow can occur bilaterally (see FIG. 2), $Z/L = 200$.

For 40 devices in parallel (60μm repeat), the resistance, R, is
$R = 1/g = 0.2 \, \Omega$ for $V_G = 0$
$R = 0.6 \, \Omega$ for $V_G$ —48 volts Both these values give resistances below 1 Ω, as desired.

From Eq. (4), the saturated current of the 40 devices in parallel $$I_{D\,SAT} = 200 \text{ amps } V_G = 0V$$
$$= 60 \text{ amps } V_G = -48V$$

These values would not normally be reached in a working device but the calculations indicates that the circuit will always operate in the linear region ($I_D << I_{D\,SAT}$ where $I_D$ is the drain current).

The voltage at which this saturation occurs may be calculated from Eq. (5).

$$V_{D\,SAT} = -70 \text{ volts } V_G = -48V$$
$$= -120 \text{ volts } V_G = 0V$$

The series resistance of the circuit when operated in the pinched-off mode is ill-defined as the current dependence on voltage is non-linear in this region. However, it is possible to estimate the leakage current expected, arising from carrier generation in the depletion region. Assuming a leakage current of $10^{-6}$ amp/cm$^2$, a total leakage of $6 \times 10^{-8}$ amps is determined assuming the entire epi region is depleted.

Figure 3:
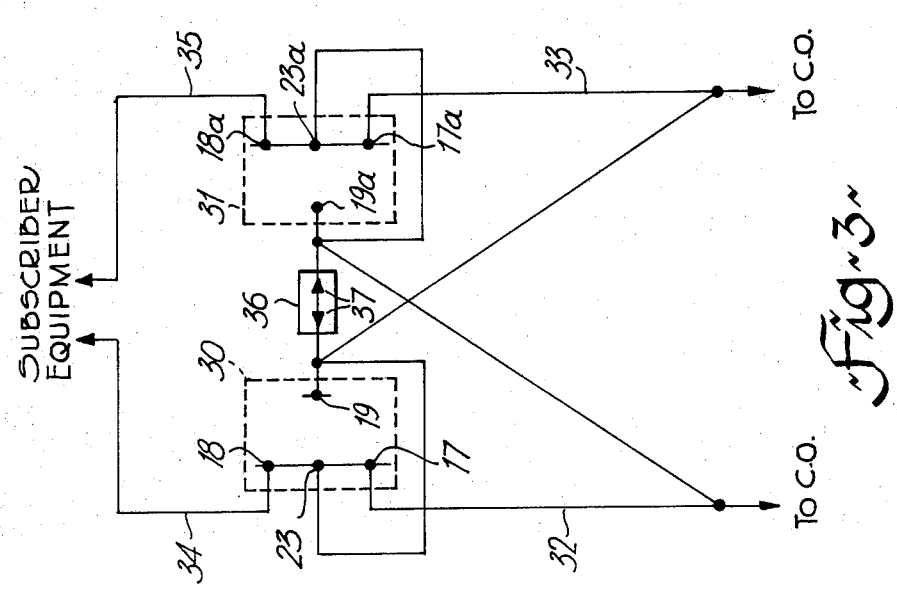
FIG. 3 is a diagrammatic circuit for one particular form of installation.

FIG. 3 illustrates diagrammatically one circuit using the present invention, using a JFET on each of the Tip and Ring lines of a telephone system. The two JFET's are indicated at 30 and 31, the source, drain and gate areas being indicated by the same reference numerals as in FIG. 1, with the JFET 31 reference numerals having the suffix $a$. The substrate and gate of each JFET are connected together so that the current "pinching" may occur from both sides of the channel, as in FIGS. 1$a$ and 1$b$. Central office conductors or lines are at 32 and 33, while subscriber conductors or lines are at 34 and 35.

In this arrangement application of a suitable dc voltage (e.g. $> 0.120$ volts) on one conductor e.g. 32 with respect to the other (33) disconnects the latter from the subscriber apparatus and connects the termination device 36. This device, connected between the gates 19, 19$a$ consists of two back to back diodes 37 in its simplest form, as shown. Other arrangements can be provided for loop testing purposes.

The devices may be separately packaged, or to reduce costs, may be all packaged together. It is a simple extension to integrate both JFET's with the termination diodes on a single chip. Proper heatsinking and packaging should be ensured to produce a rugged product capable of passing continuously 1.5 amp ( ≳ 1.1 watt), as required.

An advantage of this approach is the immunity of the circuit, when the subscriber is disconnected, to large surges in voltage as can occur, e.g., in inductive pickup from hydro lines. These fluctuations which occur in both conductors equally can be as great at 100 volts. With relays a DIAC is required to prevent spurious deactivation while testing is in progress. In the proposed JFET device, clamping is not necessary as the Gate and Source will float together, the device remaining pinched off as long as a sufficient potential difference (e.g., $>120V$) is maintained.

The fabrication of devices is simple and economic. With a 25 μm $10^{15}$ n type epitaxial layer on a p+ substrate, only three or four masking steps are required. These are:
1. source/drain diffusion window formation;
2. gate diffusion window formation;
3. contact holes formation;
4. metallization.

Masking step 3 can be eliminated by using compensating diffusions. The provision of a final scratch protection oxide layer requires an additional lithography step.

The invention provides a cheap IC substitute to replace electromechanical relays now in use in subscriber isolation devices in telecommunication systems. There are likely to be many other applications in telecommunication systems where a simple solid state device can replace a mechanical relay.

What is claimed is:

1. A solid state disconnect device for a telecommunication system including a Tip line and a Ring line, comprising: a pinch resistor element in each of said lines, each pinch resistor element including source, drain and gate areas, means connecting said lines to respective source and drain areas to connect said pinch resistor elements in said lines, an element in each line, each resistor element further including a substrate contact;
  means for electrically connecting said substrate to said gate area of each resistor element, means for electrically connecting the gate area of each resistor element to the line in which is connected the other resistor element, and a termination device electrically connected between said gate areas of said elements;
  the arrangement such that application of a suitable voltage on one of said lines with respect to the other of said lines disconnects said other of said lines and connects said termination device.

2. A solid state device as claimed in claim 1, each said pinch resistor element comprising a substrate of semiconductor material; an epitaxial layer on said substrate; an insulating layer on said epitaxial layer; source, gate and drain area apertures in said insulating layer and diffused areas in said epitaxial layer to form said source, gate and drain areas.

3. A device as claimed in claim 2, said substrate p-type, said epitaxial layer n-type, said source and drain areas n+ type and said gate area p+ type, a p-n junction depletion region formed at the junction between the substrate and the epitaxial layer and between the epitaxial layer and the gate area.

4. A device as claimed in claim 3, including metal contacts on said source, drain and gate areas and a contact layer on said substrate, whereby a negative bias applied to said gate area and said substrate enlarges said depletion regions, to at least substantially reduce current flow from the source area to said drain area.

5. A disconnect device as claimed in claim 1, each pinch resistor element comprising a plurality of pinch resistors in series.

6. A disconnect device as claimed in claim 5, said pinch resistor elements in an interdigitated pattern.

* * * * *